US 12,316,327 B2

(12) United States Patent
Chaturvedi

(10) Patent No.: US 12,316,327 B2
(45) Date of Patent: May 27, 2025

(54) PHASE INTERPOLATOR WITH SUB-PERIOD PHASE CORRECTION

(71) Applicant: Rambus Inc., San Jose, CA (US)

(72) Inventor: Divanshu Chaturvedi, Bengaluru (IN)

(73) Assignee: Rambus Inc., San Jose, CA (US)

( * ) Notice: Subject to any disclaimer, the term of this patent is extended or adjusted under 35 U.S.C. 154(b) by 58 days.

(21) Appl. No.: 18/302,213

(22) Filed: Apr. 18, 2023

(65) Prior Publication Data

US 2023/0344419 A1 Oct. 26, 2023

Related U.S. Application Data

(60) Provisional application No. 63/334,721, filed on Apr. 26, 2022.

(51) Int. Cl.
*H03K 5/13* (2014.01)
*G06F 1/08* (2006.01)
*H03K 5/00* (2006.01)

(52) U.S. Cl.
CPC .............. *H03K 5/13* (2013.01); *G06F 1/08* (2013.01); *H03K 2005/00286* (2013.01)

(58) Field of Classification Search
CPC ... H03K 5/13; H03K 2005/00286; G06F 1/08
USPC ........................................................ 327/291
See application file for complete search history.

(56) References Cited

U.S. PATENT DOCUMENTS

| | | | | |
|---|---|---|---|---|
| 6,438,721 | B1* | 8/2002 | Wente | H03L 7/07 341/120 |
| 7,009,431 | B2* | 3/2006 | Panikkar | H03L 7/0814 327/147 |
| 7,180,352 | B2* | 2/2007 | Mooney | H03L 7/0816 327/237 |
| 7,307,560 | B2* | 12/2007 | Shi | G01R 31/31727 341/120 |
| 7,593,496 | B2* | 9/2009 | Fan | H03H 11/16 331/25 |
| 8,218,705 | B2 | 7/2012 | Yousefi Moghaddam et al. | |
| 9,537,475 | B1 | 1/2017 | Iorga | |
| 10,171,091 | B2* | 1/2019 | Song | H04L 7/0087 |
| 11,206,031 | B2 | 12/2021 | Van Ierssel et al. | |
| 11,218,140 | B1* | 1/2022 | Hu | H03K 17/693 |
| 2012/0182059 | A1* | 7/2012 | Kwak | H03L 7/0818 327/299 |
| 2018/0152190 | A1* | 5/2018 | Song | H03L 7/0807 |

(Continued)

OTHER PUBLICATIONS

Abdo, Ahmad et al., "Low-Power Circuit for Measuring and Compensating Phase Interpolator Non-Linearity", 2019 IEEE 10th Annual Information Technology, Electronics and Mobile Communication Conference (IEMON), 2019. 4 pages.

(Continued)

*Primary Examiner* — Ryan Jager
(74) *Attorney, Agent, or Firm* — Silicon Edge Law Group LLP; Arthur J. Behiel

(57) ABSTRACT

A phase interpolator circuit has a first stage that selects a pair of phase vectors from among M available sets of pairs and a second stage that interpolates between the selected pair to phase align a sample clock. The interpolation functions applied to selected pairs of phase vectors can differ to account for integral non-linearity, duty-cycle distortion, phase errors, and crosstalk that vary between phase vectors.

16 Claims, 2 Drawing Sheets

(56) References Cited

U.S. PATENT DOCUMENTS

2020/0195240 A1* 6/2020 Lim .................... H03L 7/0814
2023/0344419 A1* 10/2023 Chaturvedi .............. G06F 1/08

OTHER PUBLICATIONS

Joshi, Archit et al., "An Odd Phase CDR With Phase Interpolator Trimming", IEEE Transactions on Circuits and Systems—II: Express Briefs, vol. 66, No. 1, Jan. 2019, pp. 31-35. 5 pages.
Yoon, Youngbog et al., "A DLL-Based Quadrature Clock Generator With a 3-Stage Quad Delay Unit Using the Sub-Range Phase Interpolator for Low-Jitter and High-Phase Accuracy DRAM Applications", IEEE Transactions on Circuits and Systems—II: Express Briefs, vol. 67, No. 11, Nov. 2020, pp. 2342-2346. 5 pages.

* cited by examiner

PHASE INTERPOLATOR WITH SUB-PERIOD PHASE CORRECTION

BRIEF DESCRIPTION OF THE DRAWINGS

The subject matter disclosed is illustrated by way of example, and not by way of limitation, in the figures of the accompanying drawings and in which like reference numerals refer to similar elements and in which.

DETAILED DESCRIPTION

Signal edges are precisely aligned using a multi-stage phase interpolator. A first stage that selects a pair of phase vectors, which are phase-offset clock signals with edges spread out across a unit interval. The selected phase vectors are those closest in phase to a desired edge alignment. The second stage interpolates between the selected pair to produce an output clock signal yet more closely in phase with the desired edge alignment. The interpolation function applied by the second stage can be tailored for the selected pair to account for distortion that varies between phase vectors. Edge timing of the interpolated output clock signal is thus improved.

Figure 1:
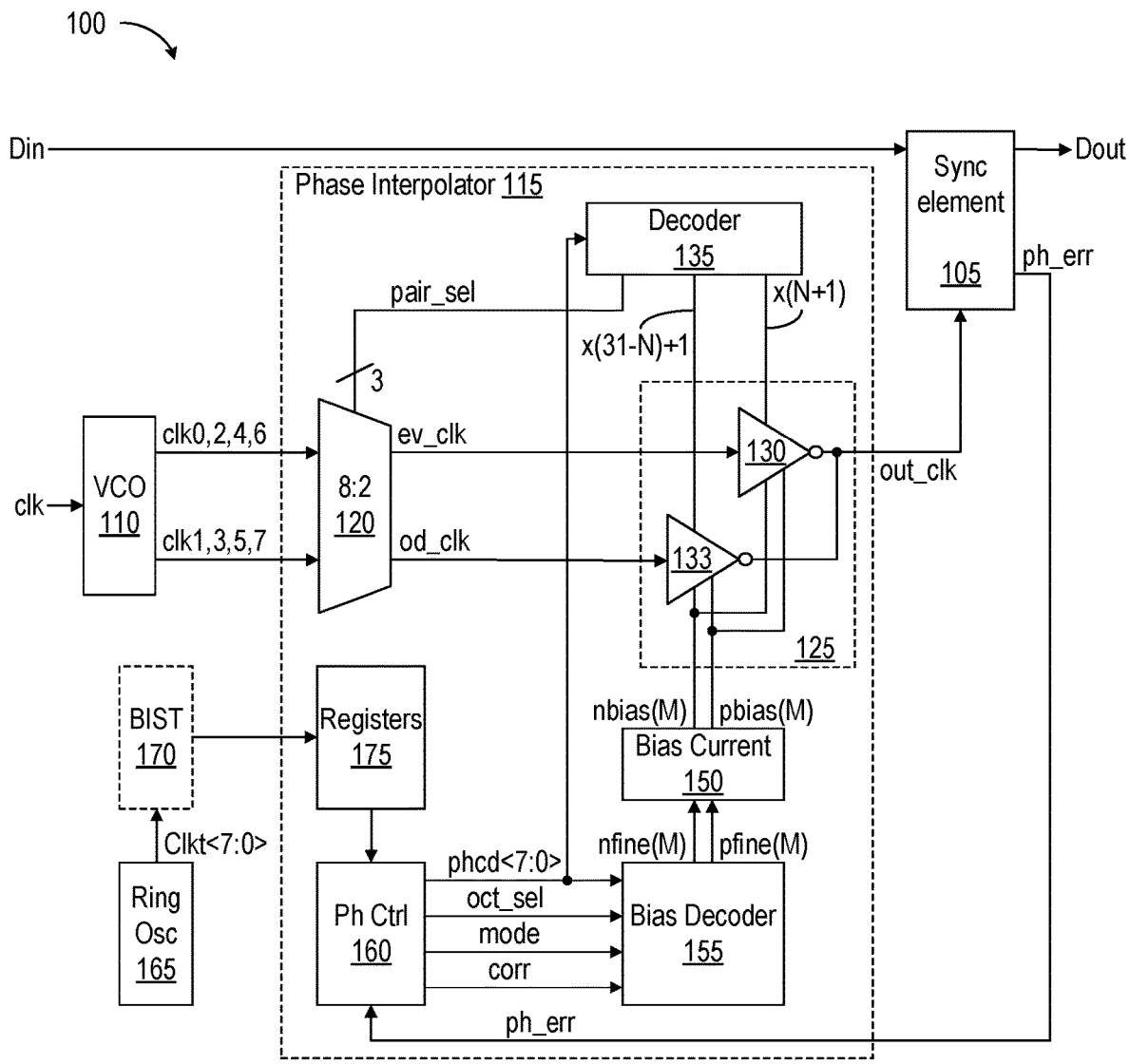
FIG. 1 depicts an integrated circuit (IC) 100 in which synchronous circuitry 105 samples an incoming data signal Din with reference to a clock signal out_clk to issue a sample data stream Dout.
Figure 1:
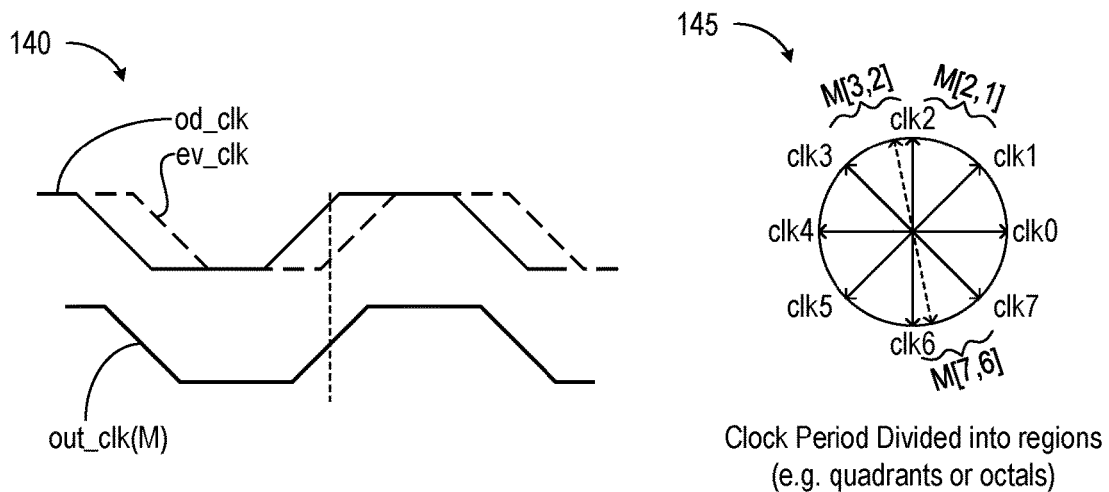

FIG. 1 depicts an integrated circuit (IC) 100 in which synchronous circuitry 105 captures an incoming data signal Din with reference to a clock signal out_clk to issue a data stream Dout. Synchronous circuitry 105 can capture signal Din using e.g. an edge-triggered flip-flop for storing and synchronizing binary symbols or a sampler that samples continuous-time symbols on edges of a clock to recover discrete-time symbols. A voltage-controlled oscillator (VCO) 110 derives eight phase-shifted clock signals clk<7: 0>, or phase vectors, from an external reference phase vector clk. A phase interpolator 115 derives clock signal out_clk from phase vectors clk<7: 0> and phase aligns clock signal out_clk with data signal Din in response to a phase-error signal ph_err from synchronous circuitry 105. Phase interpolator 115 selects pairs of phase vectors clk<7: 0> that minimize phase error ph_err and then interpolate between the selected pair for further error reduction. The interpolation functions applied to selected pairs of phase vectors clk<7: 0> can differ to account for integral non-linearity, phase errors, and duty-cycle distortion that vary between phase vectors. Phase interpolator 115 thus improves edge alignment.

Phase interpolator 115 includes a phase-select stage 120, illustrated as a multiplexer, and an interpolation stage 125 with a pair of amplifiers, current-starved inverters 130 and 133. In operation, a decoder 135 controls multiplexer 120 to select a phase-adjacent pair of phase vectors clk<7: 0> on the input nodes of stage 120 and issue them as even clock ev_clk and odd clock od_clk to respective inverters 130 and 133. Though not shown, each of inverters 130 and 133 comprises thirty-two parallel sub-inverters, each of which can be enabled or disabled to increase or reduce the overall inverter strength. Signals x (N+1) and x (31-N)+1 from decoder 135 select the active sub-inverters and thus the relative strengths of inverters 130 and 133, depending upon the value of N, such that the phase of output clock signal out_clk falls at an N-dependent phase offset between the selected phase-vector pair. The value N can range from zero to thirty-one in this embodiment so that each of inverters 130 and 133 can have from one to thirty-two active sub-inverters. Other values of N can be used.

A waveform diagram 140 at lower left illustrates how clock signals ev_clk and od_clk are interpolated. These signals are shown as single-ended but are likely differential in practical embodiments. Control variable N determines what fraction of parallel sub-inverters are enabled in each of inverters 130 and 133, and therefore their relative strengths. When N is zero, for example, inverters 130 and 133 are of respective strengths one and thirty-two. In the example of waveform 140, the phase of output clock signal out_clk is evenly space between clock signals od_clk and ev_clk, which suggest the value of N is about sixteen, halfway between zero and 31.

FIG. 1, at lower right, includes a diagram 145 using a circle to illustrate one full clock period of reference clock signal clk divided into eight phase-offset phase vectors clk<7: 0>. In this example, duty-cycle distortion unique to phases clk2 and clk6 illustrates how VCO 110 might produce phase noise that varies between sub-period phase vectors, e.g. between octants or quadrants. Phase interpolator 115 includes a bias circuit, an adjustable current source 150 in this embodiment, that can vary the currents to inverters 130 and 133 to make fine adjustments to their powers of amplification, and thus adjust the phase of output clock signal out_clk. A bias decoder 155 controls current source 150 responsive to signals from phase-control circuitry 160, signals that allow current source 150 to provide different bias currents to interpolation stage 125 for different phase-vector pairs. In the example of diagram 145, phase vectors clk2 and clk6 are offset from ideal. Bias decoder 155 can thus cause current source 150 to apply a different and corrective phase offset or offsets when multiplexer 120 delivers one of phase vectors clk2 or clk6, with its corresponding odd-clock pairing, to interpolation stage [135] 125.

Bias decoder 155 issues phase-adjustment values nfine (M) and pfine(M) to current source 150, which responsively provides bias current levels on corresponding nodes nbias (M) and pbias(M) to both inverters 130 and 133. The weighting value N determines how these bias levels are steered between inverters 130 and 133. Node nbias(M) draws the pull-down current for inverters 130 and 133, whereas node pbias(M) draws the pull-up current. Reducing the current level on node nbias(M) reduces the pull-down strength and thus slows the falling edges of output clock signal out_clk, whereas reducing the current level on node pbias(M) reduces the pull-up strength and thus slows the rising edges of output clock signal out_clk. Increasing the current levels on nodes nbias(M) and pbias(M) speeds the falling and rising edges, respectively, of output clock out_clk.

Phase controller 160 issues an eight-bit phase-control signal phcd<7: 0> to decoder 135. Decoder 135 responsively selects one of eight possible pairs of phase vectors clk<7: 0>, the adjacent pairs illustrated in diagram 145. Decoder 135 also responsively allocates the relative strengths of inverters 130 and 133. Phase controller 160 adjusts signal phcd<7: 0> to minimize phase-error signal ph_err.

Bias decoder 155 receives the subset of bits from signal phcd<7: 0> that specifies the selected phase-vector pair. This information allows bias decoder 155 to apply the correct octant-specific bias settings to current source 150. With reference to diagram 145, the octants separating adjacent pairs are labeled M [O,E], where O and E are for "odd" and "even" and M is for an interpolation function applied to bias interpolated signals within the given octant. Bias decoder 155 issues control signals nfine (M) and pfine (M) that allow current source 150 to tailor the bias current levels on nodes nbias (M) and pbias (M) for each octant. In this example, the interpolation functions for octants M [3,2] and M [7,6] are adjusted relative to the interpolation functions for the remaining octants to address the phase error of phase vectors clk2 and clk6.

Phase controller 160 provides three additional control signals to bias decoder 155. Octant select oct_sel identifies octants that require correction. A mode-selection bit or bits indicates the nature of the applied integrated non-linearity correction (e.g. all positive or all negative phase shifts). A correction weightage corr indicates the amount of bias adjustment. The mode and correction signals can be general to all phase vectors or specific to one or any subset of vectors.

Multi-phase clock generators like VCO 110 include a series of inverters. The input voltage to each inverter periodically transitions between two levels; the output does the same but inverts the sense of the input after an inverter-induced delay. The inverters thus produce a number of phase vectors, eight in this example but four is also common. Errors introduced in IC manufacturing and by power-supply noise can produce delay mismatches between inverters and between high and low voltage transitions for an individual inverter. Phase vectors may thus be unevenly spaced and otherwise distorted.

IC 100 includes test circuitry for measuring phase-vector distortion so that interpolation stage 125 can be biased to correct for sub-period phase distortion. A ring oscillator 165 is integrated with VCO 110 and produces eight phase vectors clkt<7:0>. Ring oscillator 165 includes an odd number of inverters connected in a ring such that a periodic signal spontaneously traverses the ring. Each inverter thus produces a phase vector. The inverters of oscillator 165 are replicas of those of VCO 110 and thus suffer similar process errors, supply noise, and concomitant distortion. Phase vectors clkt<7:0> thus provide measures of sub-period phase distortion that can be used to calibrate phase interpolator 115.

IC 100 includes optional built-in self-test (BIST) circuitry 170 that can load registers 175 with values indicative of the phase information from ring oscillator 165. Alternatively, measures of process skew from e.g. ring oscillator 165 can be made using external test equipment and hard coded into IC 100 using e.g. electronic fuses. However encoded, the information stored to represent sub-period phase noise is provided to phase controller 160 for use in calibrating interpolator 115 as noted previously.

Calibration is performed as a control loop that minimizes phase error ph_err from synchronous circuitry 105. In one embodiment, synchronous circuitry 105 generates signal ph_err using a circuit called an Alexander phase detector (not shown). Alexander phase detectors are well known to those of skill in the art so a detailed discussion is omitted. Briefly, data signal Din is captured during successive symbol times to produce symbols Dout (n) and Dout (n−1), and between symbol times to produce an edge sample E (n). If the adjacent samples Dout (n) and Dout (n−1) are the same (e.g., both represent logic one), then no transition has occurred and there is no "edge" to sample. Edge sample E (n) will thus be the same as samples Dout (n) and Dout (n−1). If the adjacent samples Dout (n) and Dout (n−1) are different, however, then the edge sample E (n) will match only one of them, which suggests the sample phase is biased toward the symbol time of that matching symbol. If error samples accumulate in one direction phase-error signal ph_err is responsively adjusted to cause phase interpolator 115 to correct for the phase error.

Figure 2:
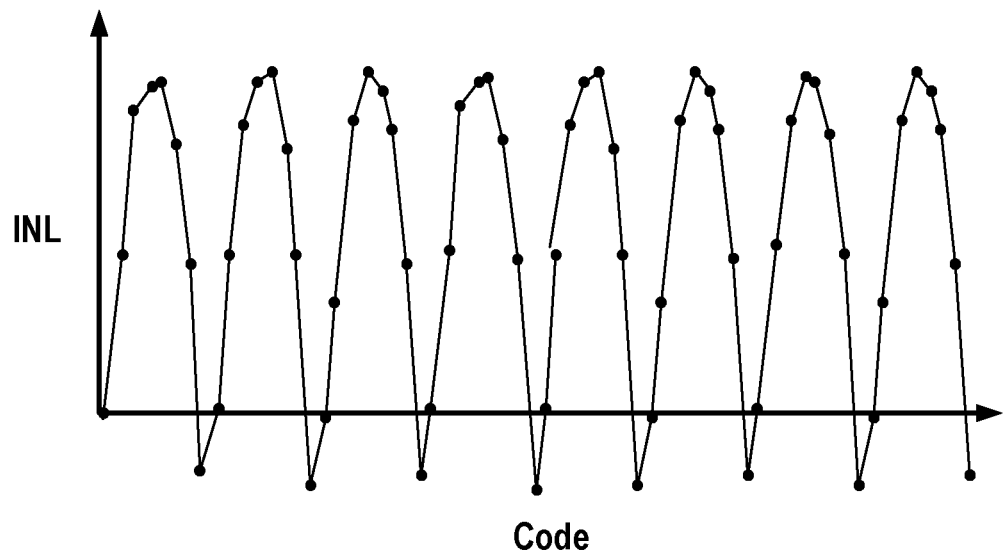
FIG. 2 depicts a pair of integral nonlinearity diagrams 200 and 210 that represent alternative output characteristics for VCO 110 of FIG. 1.
Figure 2:
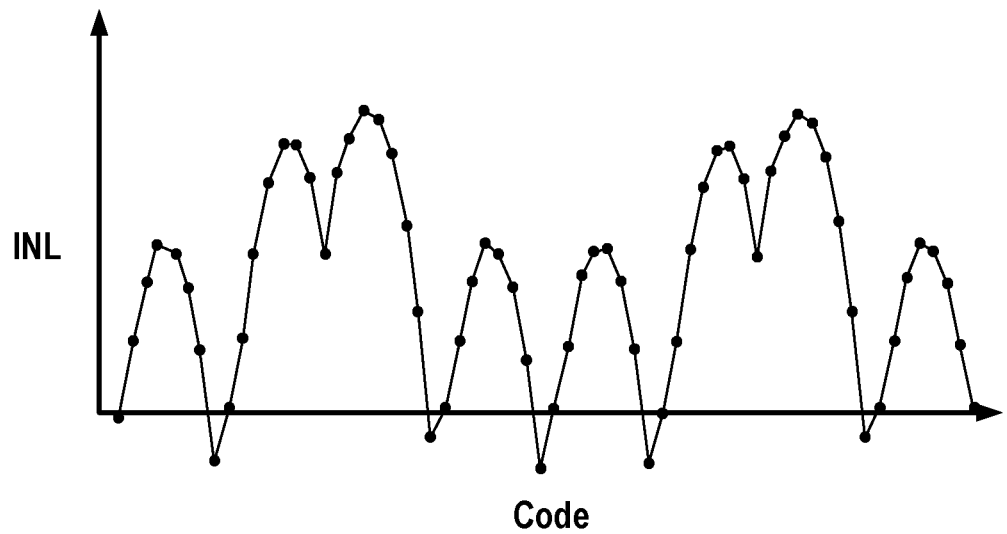

FIG. 2 depicts a pair of integral nonlinearity (INL) diagrams 200 and 210 that represent alternative output characteristics for VCO 110 of FIG. 1. INL is a measure of the deviation between ideal and measured output values of a waveform for a given input code. In this instance, the input code refers to the value of phase-control signal phcd<7:0> used to set the phase of output clock signal out_clk in a simulated circuit. The plot of diagram 200 represents INL that is the same in each octant of diagram 145 (FIG. 1), meaning that each phase vector lacks appreciable duty-cycle distortion. The plot of diagram 210 represents INL that is different for clock phases clk2 and clk6, as illustrated using the dashed arrows in diagram 145 (FIG. 1), meaning that the phase vectors for the second and sixth octants have more duty-cycle distortion than the other octants. Other sources of distortion, such as crosstalk between phase vectors or from neighboring circuitry, can produce similar timing errors. Values of the type plotted here can be translated into settings to hard-code on IC 100 or load into registers 175 for octant-specific phase calibration.

In the foregoing description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the single-conductor signal lines may alternatively be multi-conductor signal lines. Signals and signaling paths shown or described as being single-ended may also be differential, and vice versa. Similarly, signals described or depicted as having active-high or active-low logic levels may have opposite logic levels in alternative embodiments.

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in Caltech Intermediate Format (CIF), Calma GDS II Stream Format (GDSII), or Electronic Design Interchange Format (EDIF). Those of skill in the art of integrated circuit design can develop such data structures from schematic diagrams of the type detailed above and the corresponding descriptions and encode the data structures on computer readable medium. Those of skill in the art of integrated circuit fabrication can use such encoded data to fabricate integrated circuits comprising one or more of the circuits described herein.

While the present invention has been described in connection with specific embodiments, variations of these embodiments will be obvious to those of ordinary skill in the art. For example, synchronous elements in accordance with other embodiments may be adapted for use with multi-pulse-amplitude-modulated (multi-PAM) signals, and phase interpolators can be implemented using e.g. complementary metal-oxide-semiconductor (CMOS) rail-to-rail logic, CMOS current-mode logic (CML), bipolar CML, and bipolar emitter-coupled logic (ECL). Moreover, some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description. Only those claims specifically reciting "means for" or "step for" should be construed in the manner required under the sixth paragraph of 35 U.S.C. § 112.

What is claimed is:

1. A phase interpolator to produce a clock signal, the phase interpolator comprising:
   input nodes to receive respective phase vectors, each phase vector of a phase offset from the other phase vectors;
   a phase-select stage coupled to the input nodes to select pairs of the phase vectors, the pairs of phase vectors including a first pair of phase vectors and a second pair of phase vectors;
   storage to store a first phase calibration specific to the first pair of phase vectors and a second phase calibration different from the first phase calibration and specific to the second pair of phase vectors; and
   an interpolator stage coupled to the phase-select stage, the interpolator stage to combine the first pair of phase vectors using the first phase calibration to produce the clock signal of a first phase and to combine the second pair of phase vectors using the second phase calibration different from the first phase calibration to produce the clock signal of a second phase.

2. The phase interpolator of claim 1, wherein the interpolator stage comprises an amplifier to amplify and combine the selected pair of phase vectors.

3. The phase interpolator of claim 2, further comprising a bias circuit to apply a first bias level to the amplifier responsive to the first phase calibration and a second bias level to the amplifier responsive to the second phase calibration.

4. The phase interpolator of claim 3, wherein the bias level comprises a current level.

5. The phase interpolator of claim 2, wherein the amplifier comprises inverters.

6. The phase interpolator of claim 1, wherein the storage comprises a register.

7. The phase interpolator of claim 1, further comprising test circuitry to detect the phase offsets of the phase vectors, the phase offsets including a first phase offset between the first pair of phase vectors and a second phase offset between the second pair of phase vectors.

8. The phase interpolator of claim 7, wherein the test circuitry is integrated with the phase-select stage and the interpolator stage.

9. A method comprising:
   receiving phase vectors, each phase vector of a phase offset from the other phase vectors, the phase vectors including a first phase-vector pair with a first phase separation and a second phase-vector pair of a second phase separation different from the first phase separation;
   associating a first phase offset with the first phase-vector pair and a second phase offset different from the first phase offset with the second phase-vector pair;
   storing the first phase offset with the second phase offset;
   selecting one of the first phase-vector pair and the second phase-vector pair; and
   reading the one of the first phase offset and the second phase offset associated with the selected one of the first phase-vector pair and the second phase-vector pair; and
   applying the one of the first phase offset and the second phase offset associated with the selected one of the first phase-vector pair and the second phase-vector pair.

10. The method of claim 9, wherein applying the first phase offset to the first phase-vector pair comprises amplifying one of the first phase-vector pair using a first current level proportional to the first phase offset and applying the second phase offset to the second phase-vector pair comprises amplifying one of the second phase-vector pair using a second current level proportional to the second phase offset.

11. The method of claim 10, wherein amplifying the first phase-vector pair comprises inverting the first phase-vector pair.

12. The method of claim 9, wherein applying the one of the first phase offset and the second interpolation function phase offset produces a clock signal, the method further comprising:
   receiving a data signal; and
   detecting a phase error between the data signal and the clock signal.

13. The method of claim 12, further comprising selecting the other of the first phase-vector pair and the second phase-vector pair responsive to the phase error.

14. The method of claim 12, further comprising changing only one of the first phase offset and the second phase offset responsive to the phase error.

15. The method of claim 9, further comprising:
   detecting a first phase error in the first phase-vector pair;
   adjusting the first phase offset responsive to the first phase error;
   detecting a second phase error in the second phase-vector pair;
   adjusting the second phase offset responsive to the second phase error; and
   storing the adjusted first phase error and the adjusted second phase error.

16. An integrated circuit comprising:
   phase-vector nodes to receive phase vectors of a clock period;
   a select stage to alternatively select one of a first pair of the phase vectors and a second pair of the phase vectors; and
   an interpolator stage to simultaneously assign a first phase-calibration offset to the first pair of phase vectors and a second phase-calibration offset different from the first phase-calibration offset to the second pair of phase vectors, the interpolator stage to further combine the first pair of phase vectors using the first phase-calibration offset assigned to the first pair of phase vectors and the selected second pair of phase vectors using the second phase-calibration offset assigned to the second pair of phase vectors.

* * * * *